United States Patent [19]

Rinderle

[11] Patent Number: 5,203,019
[45] Date of Patent: Apr. 13, 1993

[54] RADIO RECEIVER WITH IMPROVED AUTOMATIC GAIN CONTROL

[75] Inventor: Heinz Rinderle, Heilbronn, Fed. Rep. of Germany

[73] Assignee: Telefunken electronic GmbH, Heilbronn, Fed. Rep. of Germany

[21] Appl. No.: 627,032

[22] Filed: Dec. 13, 1990

[30] Foreign Application Priority Data

Dec. 23, 1989 [DE] Fed. Rep. of Germany ....... 3942959

[51] Int. Cl.⁵ .............................................. H04B 1/10
[52] U.S. Cl. ................... 455/67.3; 455/234.1; 455/241.1; 455/295; 455/304
[58] Field of Search ............... 455/295, 296, 303, 304, 455/305, 226, 67, 226.1, 226.2, 226.3, 67.1, 67.3, 232.1, 234.1, 241.1

[56] References Cited

U.S. PATENT DOCUMENTS

| 3,492,583 | 1/1970 | Sinelli | 455/226 |
| 3,605,012 | 9/1971 | Kubanoff | 455/303 |
| 3,699,461 | 10/1972 | Huntsinger | 455/303 |
| 4,126,828 | 11/1978 | Kumagai | 325/472 |
| 4,211,978 | 7/1980 | Takahashi | 455/304 |
| 4,305,042 | 12/1981 | Tanaka et al. | 455/304 |
| 4,313,215 | 1/1982 | Jansen | 455/303 |

FOREIGN PATENT DOCUMENTS

| 0215216 | 3/1987 | European Pat. Off. |
| 0316879 | 5/1989 | European Pat. Off. |
| 673988 | 4/1939 | Fed. Rep. of Germany |
| 2914092 | 10/1980 | Fed. Rep. of Germany |
| 3024142 | 1/1982 | Fed. Rep. of Germany |
| 3134936 | 3/1983 | Fed. Rep. of Germany |
| 3210454 | 9/1983 | Fed. Rep. of Germany |
| 3531465 | 3/1986 | Fed. Rep. of Germany |
| 3447282 | 7/1986 | Fed. Rep. of Germany |
| 3505949 | 8/1986 | Fed. Rep. of Germany |
| 3729922 | 3/1989 | Fed. Rep. of Germany |
| 2569920 | 3/1986 | France |

OTHER PUBLICATIONS

Patent Abstracts of Japan, vol. 9, No. 248, (E-347)4, Oct., 1985, JP-A-60 096 930.
Patent Abstracts of Japan, vol. 13, No. 108, (P-843)15, Mar., 1989, JP-A-63 285 767.
JP 1 125813A. "Pat. Abstracts ... " E-808, Aug. 18, 1989; vol. 13, No. 374.

Primary Examiner—Reinhard J. Eisenzopf
Assistant Examiner—Edward Urban
Attorney, Agent, or Firm—Spencer, Frank & Schneider

[57] ABSTRACT

In a radio receiver in accordance with the heterodyne principle or with the homodyne principle, two additional transmission channels are provided for interference suppression. The two additional transmission channels have a different degree of distortion. Either mixing with a heterodyne oscillator signal takes place in each of the two transmission channels and the resultant intermediate frequency signals or baseband signals are added in phase opposition to give a sum signal, or the output signals of the two additional transmission channels are added in phase opposition to give a sum signal and the resultant sum signal is mixed with a heterodyne oscillator signal to give an intermediate frequency signal or baseband signal. The signals obtained after addition and mixing and derived from the output signals of the two additional transmission channels are frequency-selected and demodulated, and the demodulated signal is used for gain control.

36 Claims, 10 Drawing Sheets

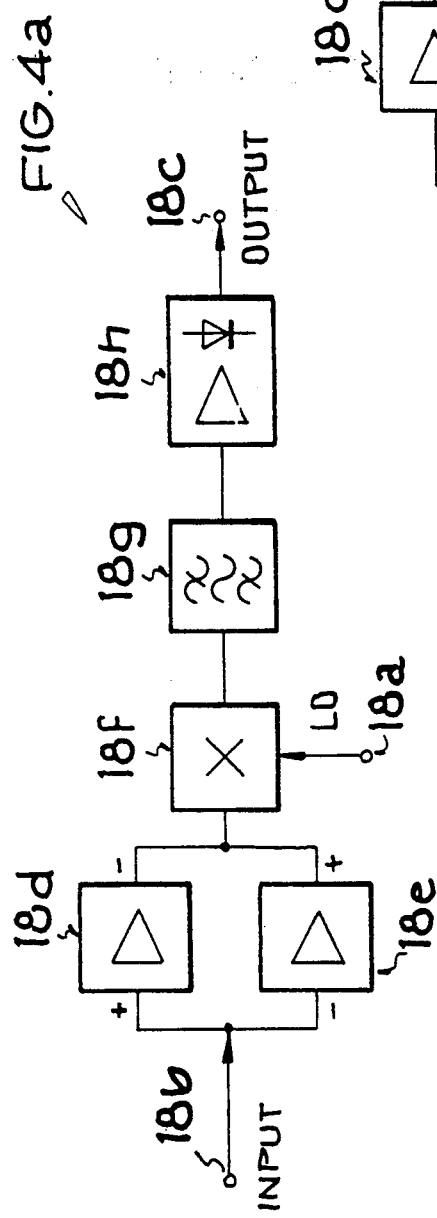
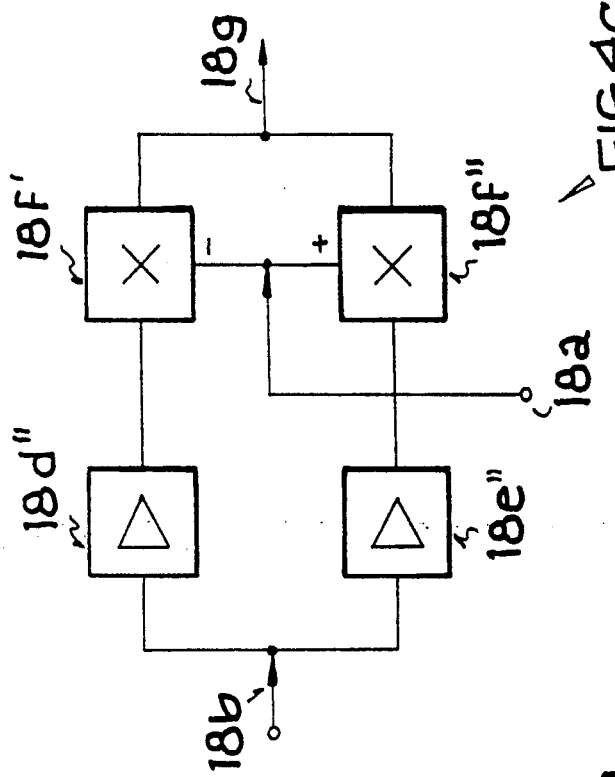
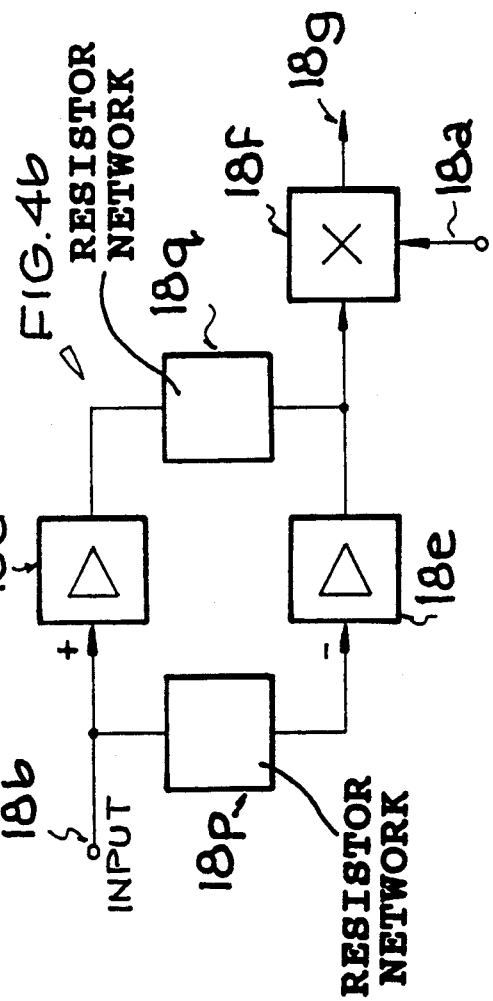

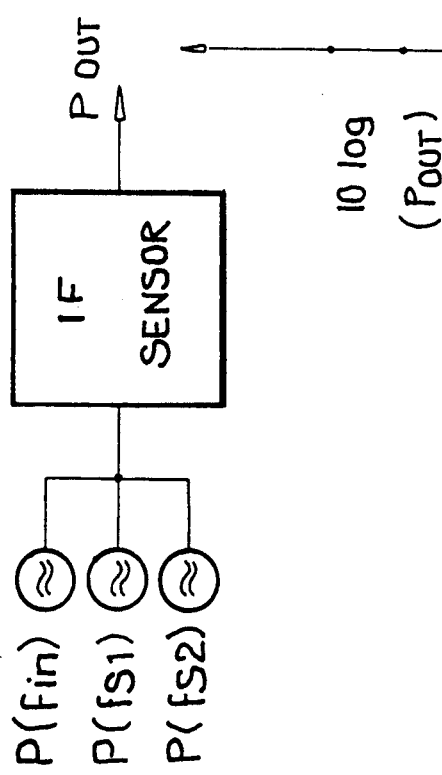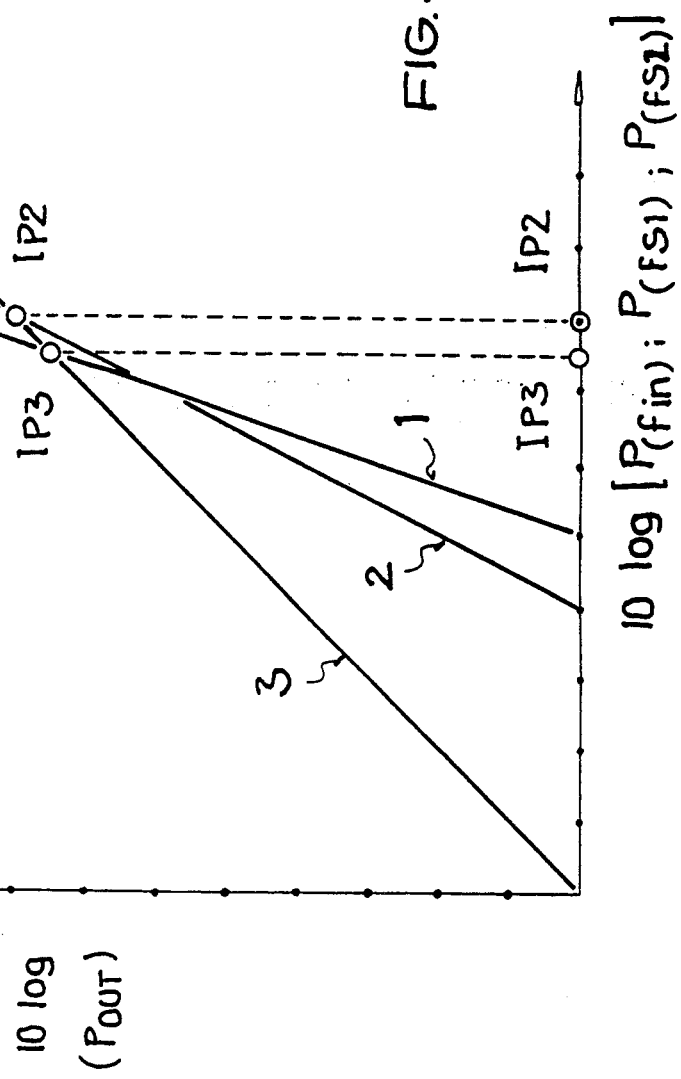
FIG. 5a
FIG. 5b

RADIO RECEIVER WITH IMPROVED AUTOMATIC GAIN CONTROL

BACKGROUND OF THE INVENTION

The invention relates to a radio receiver in accordance with the heterodyne principle or with the homodyne principle. The reception quality of a radio receiver is determined by a number of criteria, the most important of which are absolute signal sensitivity, adjacent channel selectivity and strong signal behavior. Strong signal behavior concerns mainly harmonic mixing, intermodulation and blocking.

Harmonic mixes are achieved with the formation of the intermediate frequency by mixing the harmonics of the input signals with the harmonics of the oscillator signal. Only one signal is necessary here.

The most important interference components of this type occur at the following frequencies of the interference signals:

$$f_{st} = f_{in} + \tfrac{1}{2} f_z;$$

$$f_{st} = f_{in} + \tfrac{1}{3} f_z;$$

$$f_{st} = 2(f_{in} + f_z) \pm f_z$$

where $f_{in}$ is the reception frequency, $f_{st}$ the interference frequency, and $f_z$ the intermediate frequency.

Intermodulation interference is the mixing products of at least two signals that drop into the desired reception channel with the appropriate frequency constellation. The well known intermodulation interferences occurring most strongly result from second and third order intermodulation under the following frequency conditions:

2nd order: $f_z = |f_{s2} \pm f_{s1}|$; $f_{in} = |f_{s2} - f_{s1}|$

3rd order: $f_{in} = |2f_{s2} - f_{s1}|$; $f_{in} = |f_{s1} \pm f_{s2} \pm f_{s3}|$ where $f_{s1}$ to $f_{s3}$ are the interference signal frequencies.

The determining factor for the interfering products are the non-linearity in the pre-amplifier and mixer stage, in conjunction with the degree of HF selection in the pre-amplifier.

The blocking behavior describes the reception behavior of the receiver for weak desired signals in the presence of strong in-band interference signals. This is the effect in which weak desired signals disappear in noise when strong interference signals occur in the reception band. This is the case, for example, when the gain is regulated down by a strong in-band signal, as is the case in FM radio receivers.

The main cause for reception problems is therefore non-linearities in the front end. These occur both in the active and in the passive components. The result is, in addition to the well known distortions in the pre-amp transistor and the (usually integrated) mixer, further distortions (of various type) in the varactor diodes used for tuning the RF band-pass filters.

Generally speaking, the problems with the agc concept of a classic FM radio receiver can be divided up and treated in the following main parts:

a) location of gain control in the signal path;
b) type and properties of the components controlling the gain; and
c) location and type of control signal generation.

Re. a) and b): all modern concepts use PIN diodes for control of the gain. More precisely however, it is a control of the signal attenuation in the signal path in front of the pre-amp transistor (location of signal attenuation).

Re. c): Wide-band agc has become general, but is however sometimes additionally controlled by various criteria.

The advantage of wide-band agc is that strong interference signals are attentuated before they cause, for example, heavy intermodulation or overload the varactor diodes or transistors. The drawback of wide-band agc is that the reception of weak desired signals (blocking) is impaired. Attempts are made to counter this drawback by control of the agc threshold.

Wide-band agc requires that the control signal be gained at points in the signal path with a sufficiently wide band-width. Generally, these are the mixer input (point B of FIG. 1) or the mixer output (point A of FIG. 1), which must be designed sufficiently wide bandwidth.

Whereas the band-width at the mixer input is predetermined by the RF band-width, it is possible to additionally influence the band-width at the mixer output (IF) and thereby the band-width of the agc loop. It is thus possible to achieve a restriction of the agc bandwidth.

The control of the agc threshold stems from the requirement to achieve an acceptable compromise between the requirement for good intermodulation behavior on the one hand and avoidance of strong blocking effects on the other.

For this purpose, the transmission of the wide-band agc signal from the output of the first signal detector 13 to the agc amplifier 15 is controlled by the AND GATE circuit 14 in accordance with FIG. 1, which shows the block circuit of the FM part of modern car radios. The control signal is the field-strength signal of the IF amplifier 11. This form of control of the wide-band agc only becomes effective (is switched through) when a desired signal of sufficient strength is present.

When a control system of this type is used, however, problem occurs when the receiver is tuned to an unoccupied desired channel. In this case, no control at all would be achieved in this way, with the result that an uncontrolled overload of the varactor diodes or transistors can occur, for example.

To avoid this, additional closed control loops or intervention means are provided. These are shown in FIG. 1. Via a second signal detector 16, a control signal is gained by Point C and supplied directly to the agc amplifier 15, thereby "bridging" the AND GATE 14.

Another possibility is to achieve the control signal via the third signal detector 12 (Point A) and feed of its output signal to the control line 17. With a suitable setting of the response threshold of the third signal detector 12, the AND GATE can be activated and the danger of overload avoided.

As a general principle, the blocking behavior problem occuring in known radio receivers could be largely avoided if an interference signal in the desired signal channel could be distinguished from a desired signal. In this case, a decision-making criterion would be available that permits switch-on of the agc only when the interference affects the desired channel. This would avoid the situation normal in the prior art that the reception of weak signals is disturbed by "unnecessary" controlling down of the gain (blocking).

Achievement of a control concept on this basis would however entail a new function unit permitting recognition of interference in the desired channel and generating an appropriate output signal.

SUMMARY OF THE INVENTION

The object of the invention is to provide a radio receiver that largely suppresses interference. This object is achieved in the radio receiver in accordance with the invention in that it has two additional transmission channels for interference suppression, in that the two additional transmission channels have a different degree of distortion, in that either mixing with a heterodyne oscillator signal takes place in each of the two additional transmission channels and the resultant intermediate frequency signals or basic band signals are added in phase opposition to give a sum signal, or that the output signals of the two additional transmission channels are added in phase opposition to give a sum signal and the resultant sum signal is mixed with a heterodyne oscillator signal to give an intermediate frequency signal or basic band signal, in that the signals obtained after addition and mixing and derived from the output signals of the two additional transmission channels are frequency-selected and demodulated, and in that the demodulated signal is used for gain control.

It is known that interference is disturbances resulting from harmonic mixing of interference signals with the harmonics of the heterodyne oscillator of the receiver used for mixing. Interference includes intermodulation interference caused by at least two interference signals and disturbing the desired channel.

BRIEF DESCRIPTION OF THE DRAWINGS

In the following, the invention is shown on the basis of embodiments in conjunction with the drawings, in which FIGS. 4a to 4c are block diagrams each showing an embodiment of an interference sensor in accordance with the invention, FIG. 5a is a block diagram for explaining the operating mode of an interference filter in accordance with the invention, FIG. 5b is a diagram showing the output level of an interference sensor in accordance with the invention as a function of the interference signal levels.

DESCRIPTION OF THE PREFERRED EMBODIMENTS

Figure 1:
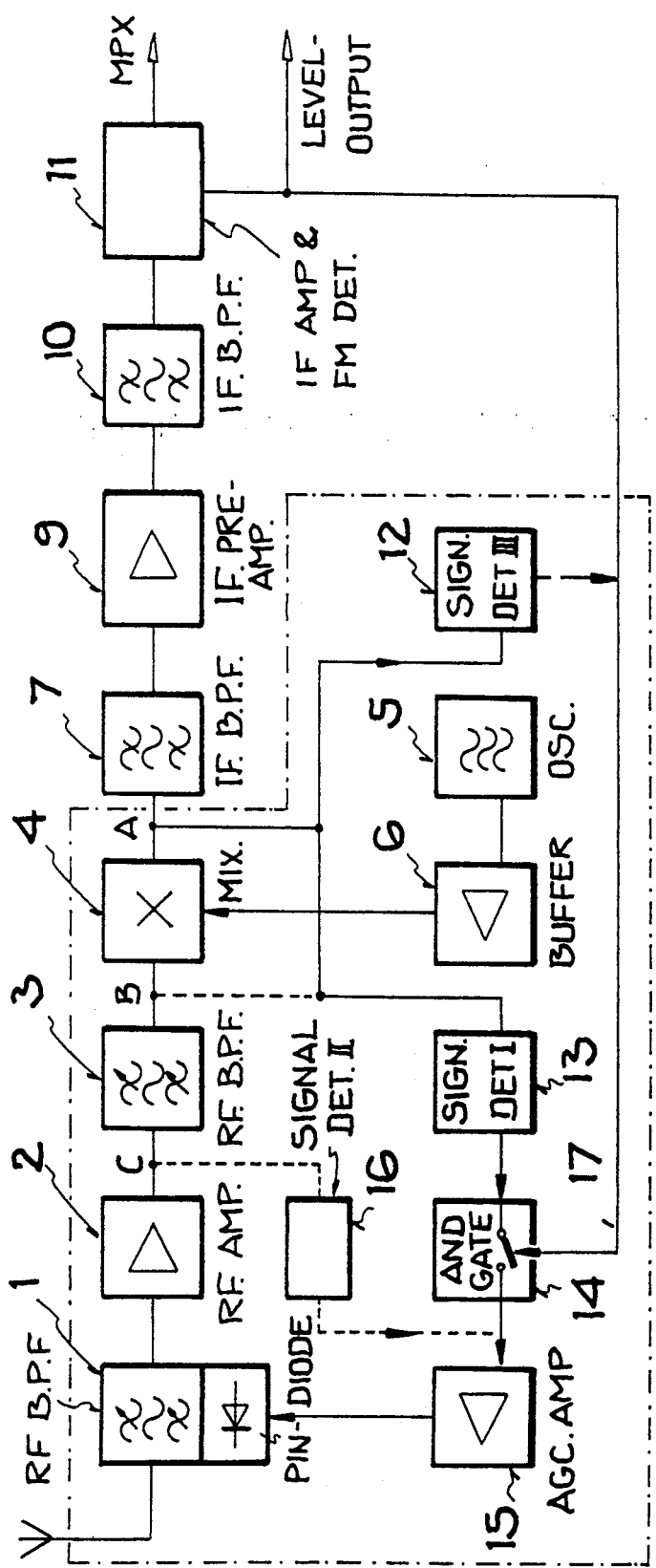
FIG. 1 is a block diagram of an FM part of a car radio according to the prior art.
Figure 2:
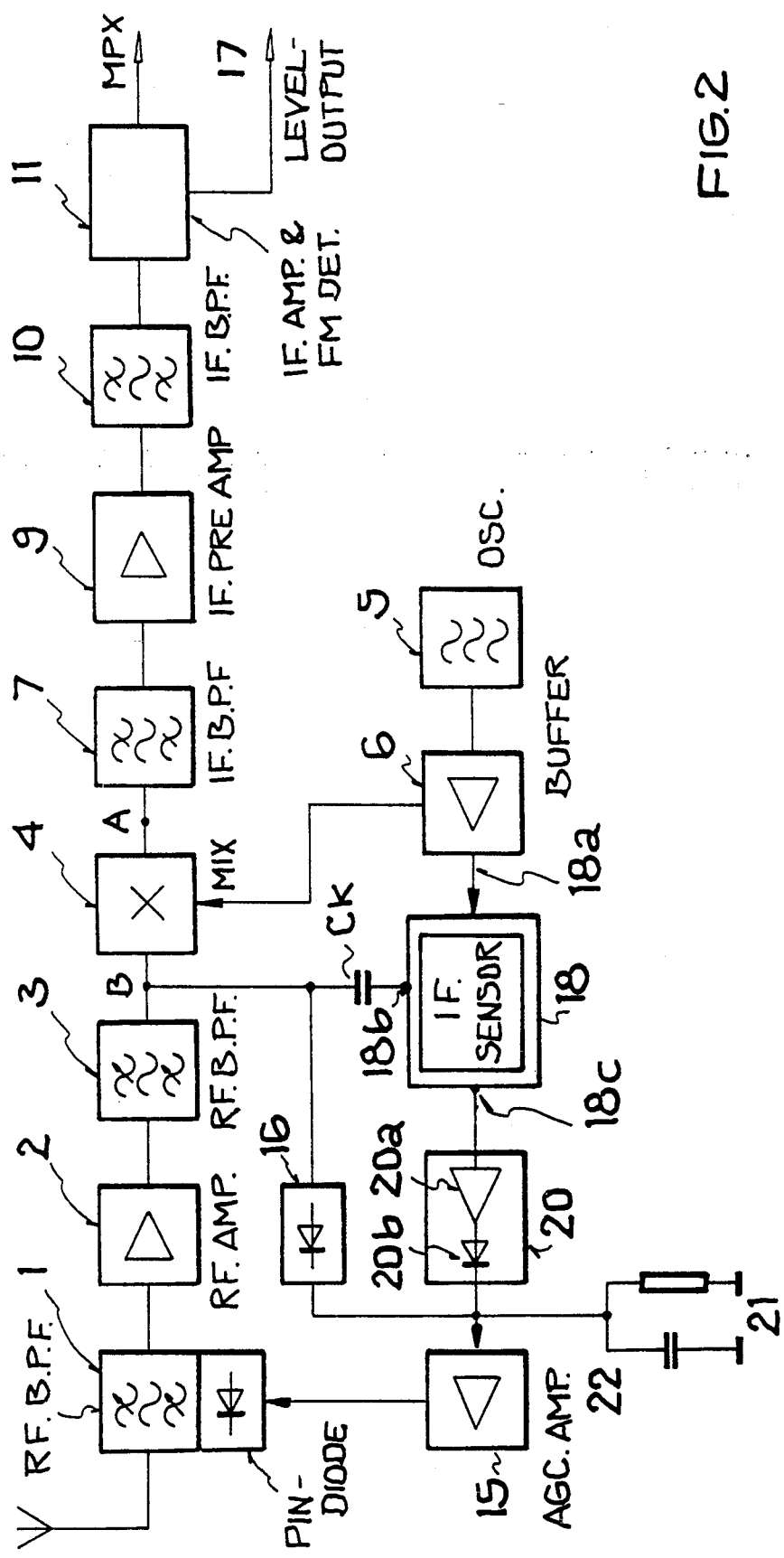
FIG. 2 is a block diagram of an embodiment of an FM part with an interference sensor in accordance with the invention.

FIG. 2 shows the basic idea of the new agc concept for an FM receiver part using an INTERFERENCE SENSOR in accordance with the invention. The classic modules shown correspond to those of the block diagram according the FIG. 1. The circuit component enclosed in a double line indicates the device (interference sensor) in accordance with an invention.

As FIG. 2 shows, the device in accordance with the invention with the reference number 18 replaces the function modules 12, 13 and 14 of the control concept according to FIG. 1. In addition, the links to the signal level at Point A and to the field strength output signal of the IF module 11 are dispensed with, unlike in the classic control concept.

The mode of operation is as follows. The unit 18 in accordance with the invention is supplied with the composite signal to be evaluated by the coupling capacitor Ck. Due to the pickup of the signal from the mixer input (point B), the composite signal has the same RF bandwidth as is effective at the input of the mixer 4.

From the available composite signal, the unit 18 senses the interference dropping into the desired channel and produces therefrom on the output line 18c a dc-signal only when interference occurs.

The sensor output signal (18c) is supplied to a signal evaluating circuit comprising the module 20 and the RC combination 21. This circuit has the job of picking up intermodulation peaks occurring for short times with a short time constant (to adjust the control argument) while causing a reduction of the control argument with a higher time constant when the interference drops rapidly. This permits effective suppression of interfering effects arising from short-term signal level fluctuations of both signal components, as encountered for example from multi-path reception or shadowing.

In the control concept according to FIG. 2, a further signal detector 16 is provided that rectifies the signal amplitude appearing at Point B and also supplies a dc-signal to the agc amplifier 15. The result is the formation of an additional closed control loop that is used for independent monitoring of the modulation of the mixer and/or of the varactor diodes at the pre-amp output and controls down the gain if there is a risk of overloading.

In an FM front end, it is normally the mixer which is the distortion-determining module, so that it makes sense to couple the input of the mixer to the input of the unit 18. The connection of the unit 18 to the mixer input is also useful when it is not the mixer, but the varactor diodes of the tuning circuit, that form the dominant interference at the mixer input. It must however be ensured here that the character of non-linearity of the unit 18 is adjusted to that of the varactor diodes.

It may however also be useful to sense the interference at another point in the circuit, e.g. in the area of the pre-amp, or to provide a second unit in accordance with the invention that is connected to a further critical point in the signal path. This would, for example, make possible the detection of interference in the pre-amp that, with higher selection, is not picked up by the unit connected there before the mixer.

Figure 3:
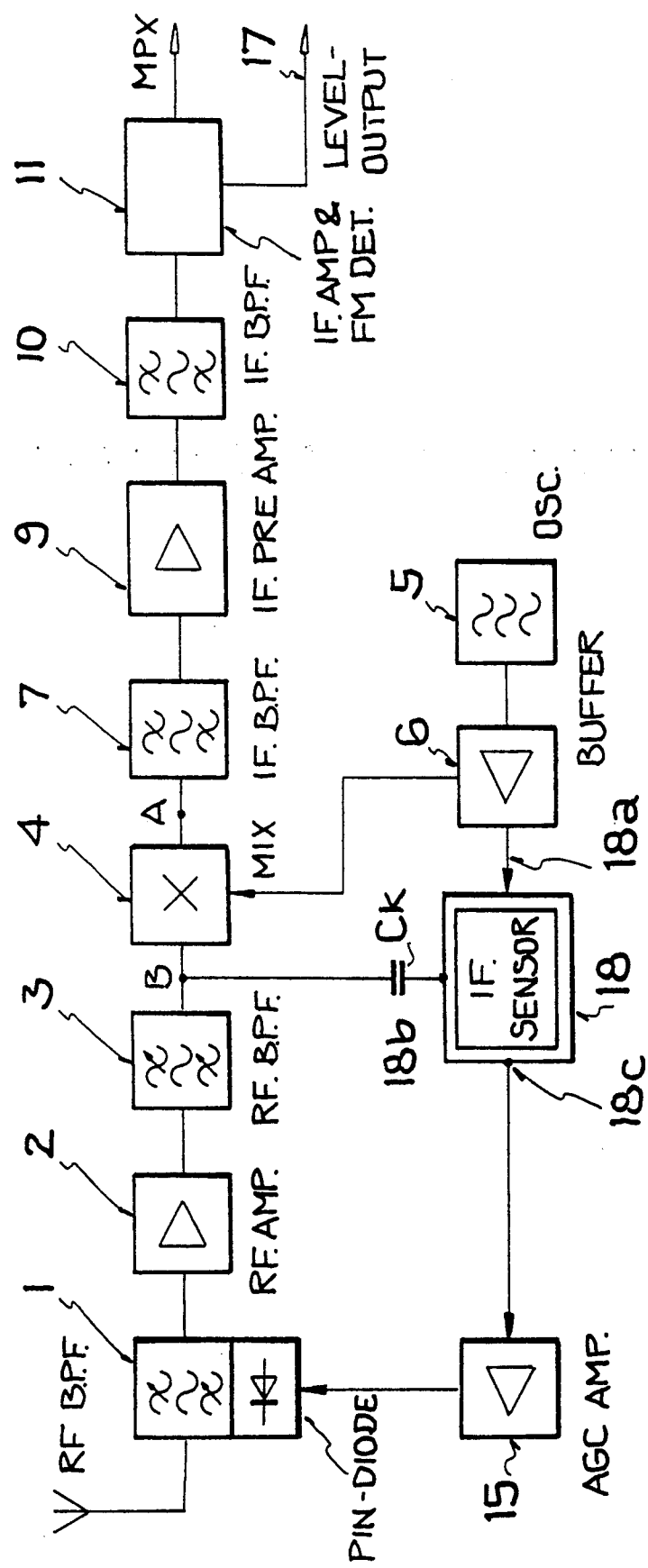
FIG. 3 is a block diagram of a further embodiment with an interference sensor in accordance with the invention.

The circuit in FIG. 3 differs from that in FIG. 2 in that the evaluating circuit 20 is not available and the output signal of the unit 18 is supplied directly to the agc amplifier 15.

FIG. 4 shows three circuit principles of a unit 18 in accordance with the invention, the function contents of which correspond to those of the function unit 18 enclosed by a double line in the block diagram according to FIG. 2, including the reference numbers 18a, 18b and 18c for the input and output terminals.

In the embodiment according to FIG. 4a, the input signal to be transmitted is supplied via the terminal 18b to a non-inverting RF amplifier 18d and to an inverting RF-amplifier 18e. The output signals of both amplifiers are combined at the input of the mixer 18f and mixed therein with the heterodyne ocsillator signal (LO). Using the IF band pass filter 18g, the signal components dropping into the IF band are filtered out, further amplified in the module 18h, and rectified. The dc-signal corresponding to the channel interference is then available at output 18c as a control signal for gain.

Provided that the gains of the two RF input amplifiers 18d and 18e have the same value, no RF signal components result at the input of the mixer, since the signal components compensate one another at the output on account of the signal inversion in the amplifier 18e.

A divergence from this behavior occurs when the two amplifiers have different characteristics as regards linearity and phase and are subjected at the same time to larger input signals. In this case, there are divergences in the amplifier output signals that generate a corresponding output signal at the terminal 18c (FIG. 4a). The amplifiers 18d and 18e form the additional transmission channels in accordance with the invention, whereas the unit in accordance with the invention comprises the two additional transmission channels (18d, 18e), the mixer 18f, the filter 18g and the IF amplifier and demodulator (18h). The demodulator supplies a signal corresponding to the interference of the desired channel.

The principle of the sensor or unit in accordance with the invention is to design non-linearities in the two RF amplifiers (18d, 18e) such that the same interference components as in the signal path of the receiver are generated, but with lower interference signal levels.

Since the desired signal components are compensated in accordance with the present principle, the sensor output generates practically only signals resulting solely from the distortions. Without this compensation of the wanted signal, a dc-signal affecting the control process would be generated at the sensor output even by a (weaker) desired signal, which is not desirable in the control concept.

In the embodiment according to FIG. 4b, the two RF amplifiers (non-inverting amplifier 18d and inverting amplifier 18e) are identical with respect to their transmission characteristics and the different linearity for both branches is effected by differently-sized signal amplitudes at the amplifier inputs, e.g. by damping the signal amplitudes from the sensor input to the input of the amplifier 18e'. To restore the equality of the gain of both branches in relation to the mixer input, a corresponding signal-attenuating network is provided. This network comprises, in the embodiment in FIG. 4b, the circuit parts 18p and 18q. The circuit part 18p is connected between the input (18b) of the amplifier 18d and the input of the amplifier 18e. The circuit part 18q is connected between the output of the amplifier 18d and the output of the amplifier 18e. The circuit parts 18p and 18q comprise, for example, a resistance network in each case.

The advantage of an array in accordance with FIG. 4b is that the two amplifiers (18d, 18e) can be of identical design and that the precision of the compensation is substantially dependent only on the (integrated) signal divider networks (18p, 18q).

In the embodiment in FIG. 4c, the two signal components are not combined until the input of the IF bandpass filter 18g. For this purpose, the (directly aligned) output signals of the two RF amplifiers (18d, 18e) are supplied to separate mixers 18f' and 18f''. In this case, the required reverse signal addition is achieved by antiphase local oscillator signal of the mixers 18f' and 18f''.

The necessary differing non-linearity of the branches can be achieved in the RF part, as shown in principle in FIGS. 4a and 4b. Solutions where this is achieved in the mixer part are also possible.

FIG. 5b shows the (theoretically) obtained characteristic of an interference sensor design in accordance with the invention. In the double-logarithmic illustration, the interference signal levels (Ps1 and Ps2) at the sensor input are plotted on the abscissa and the DC output level (Pout) on the ordinate. FIG. 5a schematically shows the interference signals and a desired channel $f_{in}$ as inputs to an IF sensor.

Curve 1 characterizes, for example, the signal behavior for 3rd order distortions when two interference signals of equal level are present at the input whose intermodulation products drop into the desired channel ($f_{in}$).

Curve 2 characterizes, for example, the signal behavior for 2nd order distortions when two interference signals of equal level are present at the input whose intermodulation products drop into the desired channel ($f_{in}$) or result directly in the intermediate frequency ($f_z$).

For comparison, curve 3 shows the relationship between the output signal and an input desired signal (identical level scales are assumed for coordinate axes) if an amplifier branch (e.g. 18d or 18e in FIG. 4a) were not provided, i.e. if no desired signal compensation were to take place.

The output level then rises with the input level for the intermodulation interference of the 2nd order with twice the gradient and for the 3rd order with three times the gradient, compared with the linear case (curve 3).

The intersection points IP2 and IP3 are the so-called (theoretical) intercept points. IP2 characterizes the behavior for the intermodulation distortions of the 2nd order and IP3 for those of the 3rd order.

FIG. 5b shows only the sensor characteristic for intermodulation interference of the 2nd and 3rd order as an example. This interference is generally also dominant. As a general principle however, a sensor of that type reacts to interference of all types. To that extent, comprehensive protection from interference by the use of an optimized sensor is conceivable.

The following states the main requirements placed on an interference sensor (unit) in accordance with the invention. For correct recognition of all interference arising in connection with the non-linearities in the FM front end with the aid of the interference sensor, the characters of the non-linearity of the sensor and of the function stage causing the undesired interference must be identical if possible. In addition, the band-width and the selection of the IF band-pass filter (18g) in the interference sensor should be similar to that of the IF channel of the receiver.

It must also be possible to adjust the sensitivity of the sensor and the location of the connection to the prevailing conditions or requirements. These conditions are, for example, the quality of the interference suppression or the varying interference sensitivity of the signal path. By signal path or standard transmission channel is meant the reception signal path of a receiver from the antenna via the input stage (1,2), the selection filter 3, the mixer 4 with the local oscillator 5 for generating the heterodyne oscillation signal, the selection filter 7 for the intermediate frequency, the IF pre-amplifier 9, a second band-pass filter 10, and an IF amplifier with demodulator 11. The latter case can come about when the varactor diodes determine the interference behavior. In this case, the interference behavior generally alters with the tuning voltage.

The sensor output signal should if possible correspond only to the relevant interference component, i.e. so that the desired signal component in the output signal must be suppressed.

The sensor circuit itself must not cause additional interference in the desired channel. This could happen when, for example, the (required) non-linearity of the sensor acts on the reception mixer via the sensor input.

Figure 6:
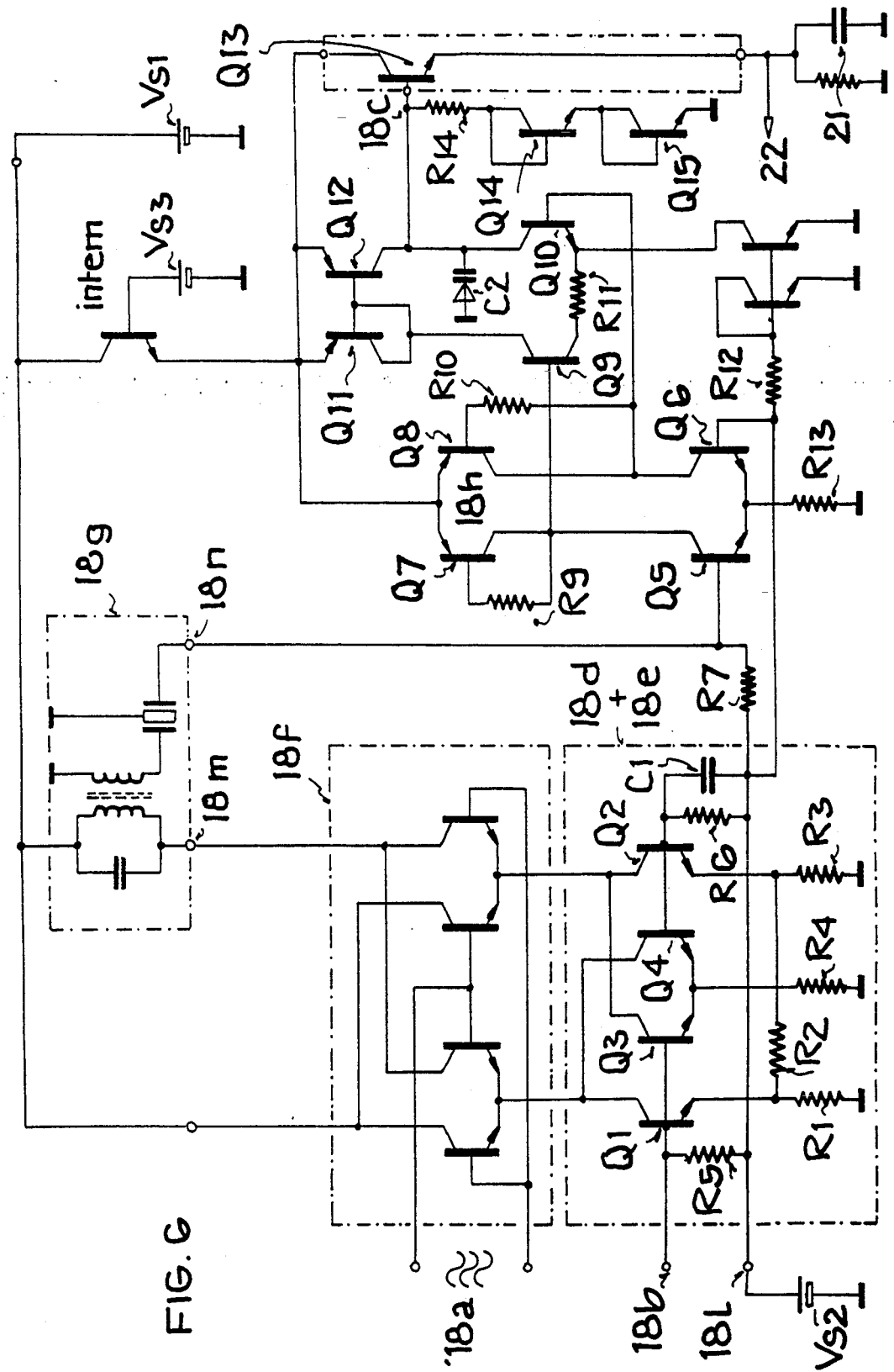
FIG. 6 is a circuit diagram of an embodiment of an interference sensor in accordance with the invention.

FIG. 6 shows an example of the circuitry for an INTERFERENCE SENSOR according to the principle 1 shown in FIG. 4a, including the assessment circuit for short-term interference peaks. The RF amplifiers 18d and 18e are designed as differential amplifiers comprising the transistors Q1 and Q2 (18d), and Q3 and Q4 (18e).

The amplifier 18d has a negative feedback network in the emitter branch comprising the resistors R1, R2 and R3, whereas no negative feedback is used in amplifier 18e. The result is differing linearity in the two RF amplifiers. The reverse addition of the output signals is effected by the appropriate exchange of the collector connections. The compensation of the small amount of transconductance caused by negative feedback in the amplifier 18d is balanced out by a lower operating current in the amplifier 18e (via R4 with preset voltage Vs2).

The mixer 18f is supplied with the output signals of the RF amplifiers (18d, 18e), in particular to the emitters of the transistor array operating as multiplier, while the heterodyne oscillation signal is feeding the bases of the transistors via the terminal pair 18a. The intermediate-frequency output signal of the mixer 18f is supplied (unsymmetrically) via the terminal 18m to the IF band-pass filter 18g. The relevant composite signal is available at the output 18n of this filter and is further amplified in the subsequent circuit part 18h and the rectified.

The signal is amplified in this circuit part in the differential amplifier stage with the transistors Q5, Q6, Q7 and Q8. Signal rectification is achieved by the circuit array formed from the transistors Q9, Q10, Q11 and Q12 and emitter resistor R11. The rectified signal is available at the switching point 18c. The Q14, Q15 and R14 combination is used for setting of the rectifier characteristics.

The signal evaluation circuit 20 comprises the emitter follower Q13 which acts in conjunction with the RC combination 21 as the peak value rectifier to ensure a peak-evaluated output signal at terminal 22.

This circuit form of the sensor suits particularly well an RF amplifier section of a reception mixer circuit having the same structure as the RF amplifier 18d of the sensor and in which the base potentials too of the transistors in the RF amplifiers correspond to the base potentials of the transistors of the RF amplifiers of the sensor.

Figure 7B:
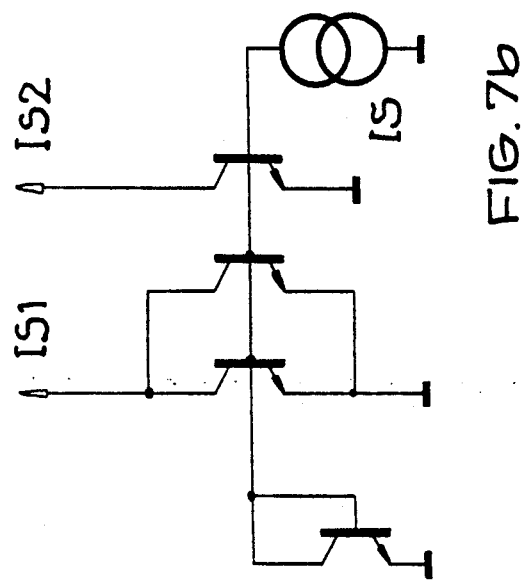
FIG. 7b is a circuit diagram showing generation of the operating currents for the RF part according to FIG. 7a, FIG. 8 is a circuit diagram of a further modification of the RF part of the interference sensor according to FIG. 6.
Figure 7A:
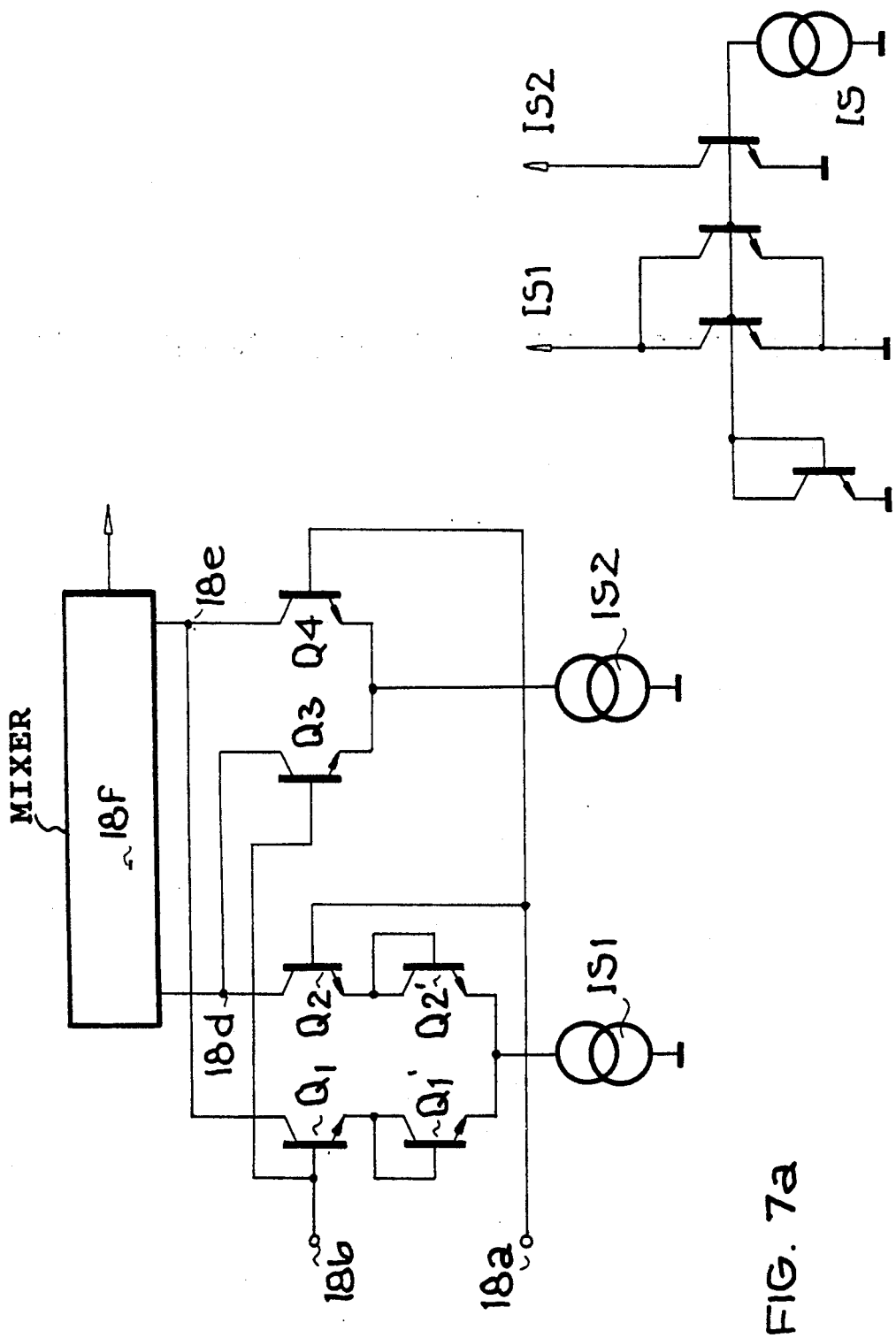
FIG. 7a is a circuit diagram of a modification of the RF part of the interference sensor in accordance with FIG. 6.

The circuit according to FIG. 7a shows a modification of the RF part of the sensor. Unlike in the circuit shown in FIG. 6, there is no resistance network provided in the RF amplifier 18d, but a transistor pair Q1'/Q2' for negative feedback. The difference in the non-linearity of both RF amplifiers is defined, and corresponds to the difference between two identical differential amplifiers in which one (18d) is fed with half the amplitude of the interference signals.

The transconductances of both amplifiers are defined just as well. With the same operating current level Is1 or Is2, the gain of the amplifier 18d would in the present circuit be exactly half that of amplifier 18e. To achieve desired signal compensation at the output of the RF amplifier, the ratio of the operating currents Is2/Is1=0.5 must be selected in accordance with transistor characteristics laws.

These clear laws mean that this circuit structure is very interesting for the RF amplifier section. A particular advantage of this circuit is that when the operating currents are generated by a current-mirror circuit as shown in FIG. 7b, the gain (sensitivity) of the sensor can be set using a control current (Is') without altering the desired signal compensation and the character of non-linearity of both amplifiers, not even in relation to each other.

Thanks to this (checked) controllability, adjustment to the various conditions of the circuits is easily achieved by electronic means.

The circuit in accordance with FIG. 7a generates, because of its symmetrical structure, only distortions of uneven order (3rd, 5th etc.). As a result, checked pickup of the main distortions of the 2nd order is not possible.

One possibility of designing the circuit with a defined unsymmetry and so picking up distortions of the 2nd order is to make the emitter current densities in the respective branches of the differential amplifiers unsymmetrical. This can be achieved simply by differently sized emitter area of the transistors based on FE (Q1, Q1')>FE (Q2, Q2') and FE (Q4)>FE (Q3). Here, the ratio of the emitter areas can be greater than or smaller than 1. The important thing here is that the allocation of the area ratio between the two branches is preserved in accordance with the above formula. If the allocation is incorrect, the 2nd order distortions cancel each other out at the amplifier output. The degree of distortion can be adjusted by the size of the area ratio of the emitter branches.

A further possibility of setting different emitter current densities is in the setting of different base potentials (18b, 18l). The currents Is1 and Is2 (FIG. 7a) are, for example, generated in accordance with FIG. 7b by a current-mirror circuit in which a current source Is supplies the input current for the current-mirror. The current-mirror circuit of FIG. 7b supplies the output currents Is1 and Is2. Using the current inverter in FIG. 7b, the sensitivity of the sensor (unit) in accordance with the invention can be controlled.

Figure 8:
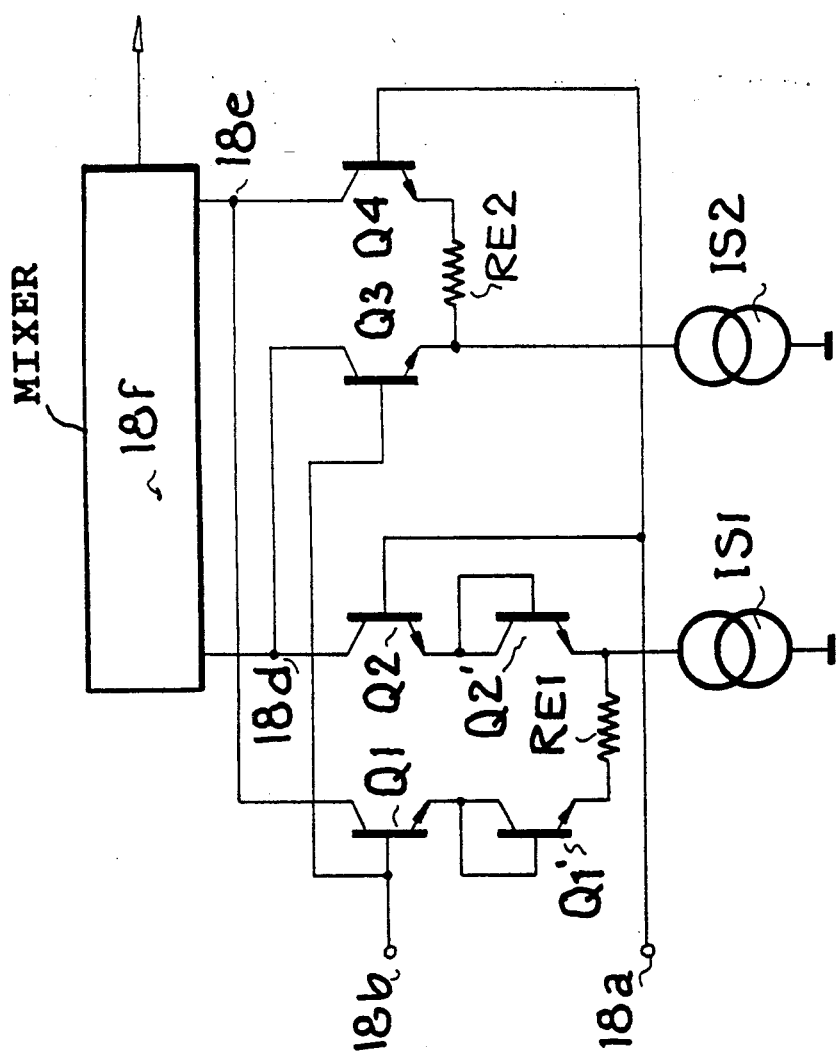

FIG. 8 shows a second modification of the RF part of a sensor that can also pick up 2nd order distortions. For this purpose, the emitter resistors RE1 and RE2 are provided for unsymmetrical design of the circuit.

The degree of distortion can be set with the value of the resistance value. It is best here to select the resistance values such that the negative feedback degrees caused by these resistors in both amplifiers (18d, 18e) are of identical size in relation to one another. It must be borne in mind that the 2nd order distortions do not compensate at the amplifier output but add up. For this purpose, the supply of operating current (Is1, Is2) is necessary as shown in FIG. 8.

Figure 9:
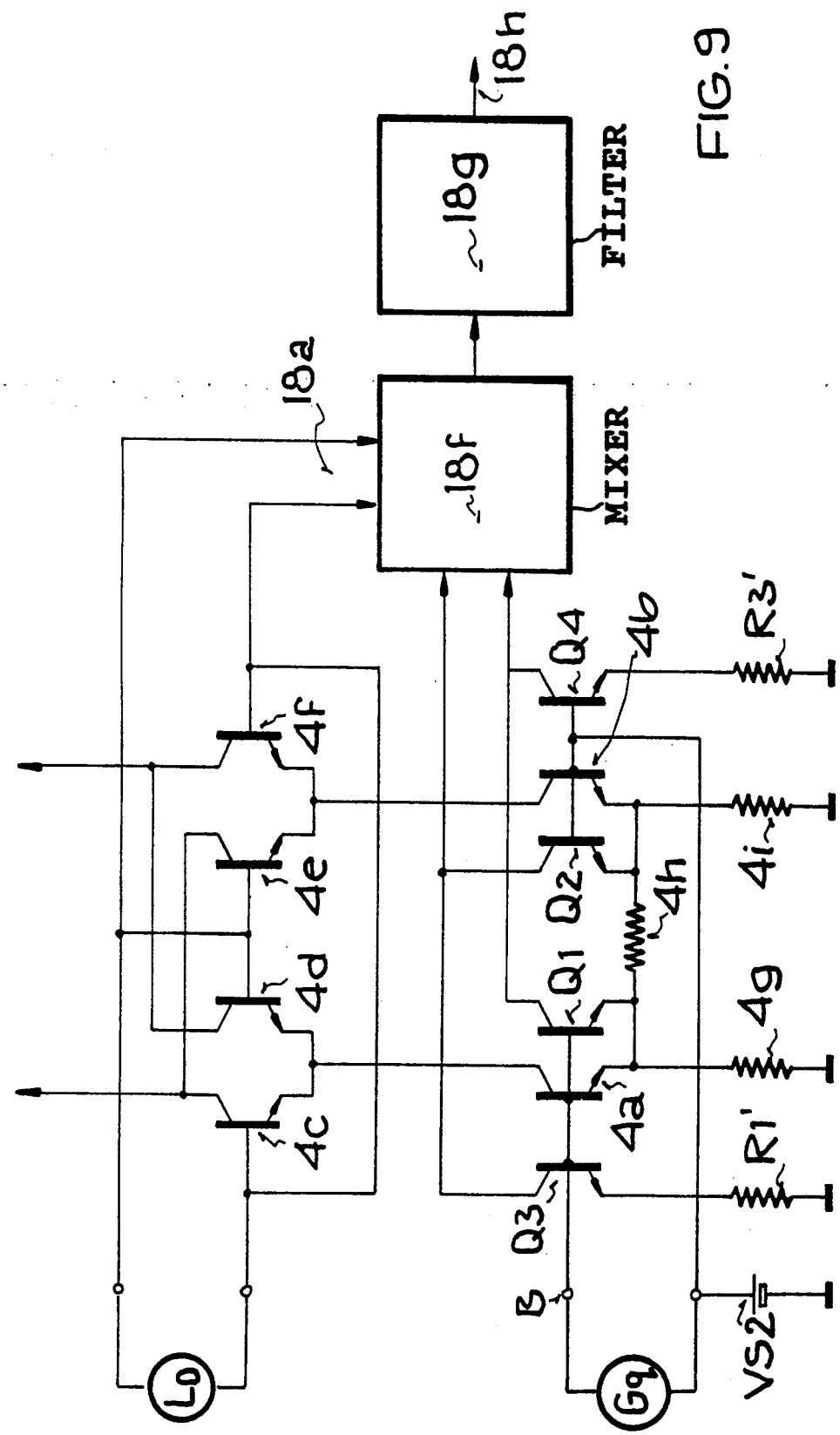
FIG. 9 is a circuit diagram of a further embodiment of an interference sensor in accordance with the invention and FIG. 10 is a circuit diagram of a final embodiment of an interference sensor in accordance with the invention.

FIG. 9 shows a circuit in which the RF amplifiers of the sensor are combined with the circuit of the reception mixer. The reception mixer comprises here items 4a to 4f, where the RF part of the reception mixer is formed by transistors 4a and 4b and the resistors 4g, 4h and 4i, and the multiplier by the transistors 4c, 4d, 4e and 4f. The transistors Q1 and Q2 form the first RF amplifier branch of the sensor and transistors Q3 and Q4 the second RF amplifier branch of the sensor.

The sensor mixer 18f, which is fed by the output signals of the sensor RF amplifier (Q1, Q2, Q3 and Q4) is separated from the reception mixer as in the previous examples. The reception mixer and sensor mixer are fed jointly by the heterodyne oscillation signal. In the present example, the input signal, shown as source Gq, controls unsymmetrically the input of the reception mixer and of the sensor mixer via the bases of the transistors 4a, Q1 and Q3. The base potentials of transistors 4a, 4b, Q1, Q2, Q3 and Q4 are determined jointly by the bias voltage source Vs2.

In the embodiment according to FIG. 9, the non-linearity of the one sensor RF amplifier with the transistors Q1 and Q2 is equal to the non-linearity of the RF amplifier section of the reception mixer circuit with the transistors 4a and 4b, while the second sensor RF amplifier with the transistors Q3 and Q4 in conjunction with the resistors R1' and R2' has a much lower non-linearity. The amplifier branch with Q4 and R3' is not effective as regards signals when feeding is unsymmetrical.

The circuit according to FIG. 9 means that the non-linearity of the sensor is practically identical to that of the reception mixer, thereby permitting an outstanding and reproducible adjustment of the sensor to the reception mixer.

The compensation of the desired signal at the output of the two Rf amplifiers of the sensor is determined by the selection of suitable area ratios of the emitters of transistors Q1, 4a and Q2, 4b, and of the resistors R1' and R3' respectively. It is best here to select the emitter area of transistors Q1 and Q2 substantially lower than those of transistors 4a and 4b respectively (e.g. 1/20 to 1/10). The result is that the sensor has only a minor effect on the reception mixer and that the RF section and mixer of the sensor requires little operating current relative to the reception mixer. The circuit embodiment according to FIG. 9 is intended for unsymmetrical signal feeding (Qq). It can however be easily modified for symmetrical signal feeding.

Figure 10:
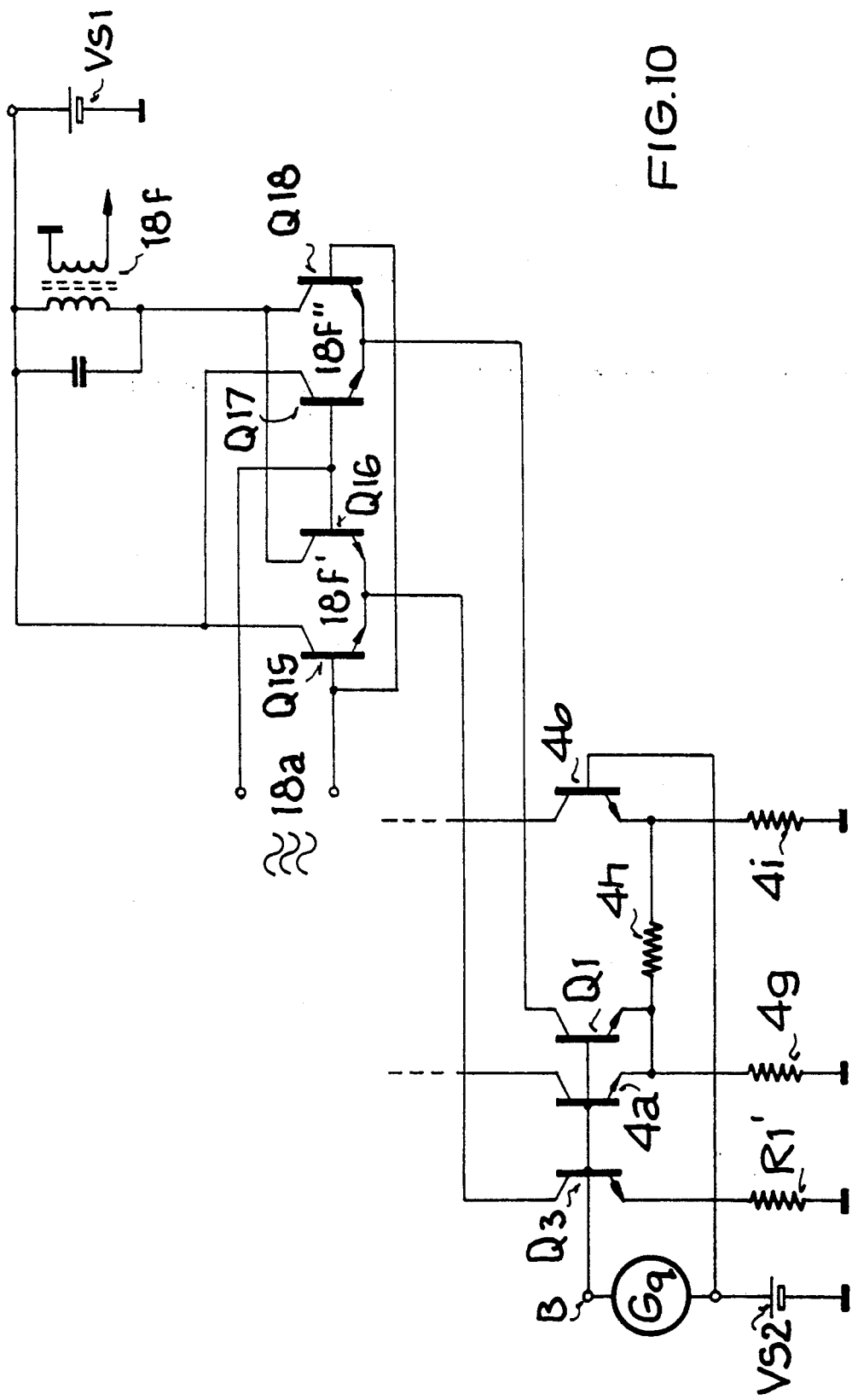

FIG. 10 shows a simplified circuit for the circuit combination of reception mixer and sensor derivable from the circuit according to FIG. 9 when only unsymmetrical feeding (Gq) is exclusively provided. The circuit according to FIG. 10 differs from the circuit according to FIG. 9 in that among other things the RF amplifiers of the sensor comprise only the circuit components Q1, Q3 and R1'. Due to the lack of the RF amplifier branch with the transistor Q2 (FIG. 9), a correspondingly lower gain of this branch must be set for compensation of the desired signal using the amplifier branch Q3 and R1'. The gain of this branch can, for example, be set using the resistor R1'.

The output signals of the sensor Rf amplifiers are supplied in each case to a separate sensor mixer 18f and 18f'' comprising transistors Q15 and Q16 or Q17 and Q18 respectively. While the output signals of the sensor RF amplifiers are supplied to the emitter branches of the mixer transistors, the heterodyne oscillation signal is supplied to the bases of these transistors. The antiphase addition of the signal components of both signal paths takes place at the (unsymmetrical) outputs of the two sensor mixers connected to the selection unit 18g. The circuit according to FIG. 10 therefore corresponds to principle 3 in FIG. 4c.

In the previously described embodiments for the sensor circuit, it is assumed that the desired signal component at the sensor output is suppressed (compensated) in order to avoid undesired control by the desired signal. This is unwelcome because it would cause a rise in the signal/noise ratio no longer proportional to the desired signal level as the desired signal level rises. It can however be useful to avoid desired signal compensation in the sensor and instead of that to suppress the desired signal only to a certain value, i.e. only to the extent that control is commenced by a desired signal when a certain signal/noise ratio (e.g. 60 dB) is reached for the desired signal, or is commenced not later than when no further increase could be expected anyway in the signal/noise ratio as the desired signal level rises for other reasons. This is for example the case in FM radio reception, e.g. above an antenna desired signal level of 0.3 to 1 mV (at 75 Ohms).

The advantage of this limitation of the desired signal suppression set in this way in the sensor unit and therefore of the corresponding agc threshold is that overload effects are avoided by the desired signal (e.g. at the reception mixer output).

The described method for suppression of interference in radio receivers can be applied not only to radio receivers based on the classic superhet principle in which the reception signal is converted to an intermediate frequency signal before signal demodulation, but also to radio receivers operating to the homodyne principle. With this receiver principle, the reception signal is, as is well known, converted directly into the base band, for which reason this reception principle is better known under the designations "Direct Conversion Concept" or "Zero IF Concept".

When the method is used to suppress interference in receivers with reception principles of this type, a base band amplifier with low-pass characteristic is used instead of the IF amplifier and demodulator. A base band amplifier of this type takes over the selection of the IF amplifier with selection characteristic. The base band amplifier provided is of similar design to the base band amplifier in the reception part. The sensor mixer operates in this case as a direct mixer in which the frequency of the heterodyne oscillator signal is equal to the reception frequency.

What is claimed is:

1. A radio receiver for use with an antenna, comprising:
 a first mixer;
 means for conveying a received signal to the first mixer along a signal path from the antenna to the first mixer, the means for conveying including agc means for controlling the amplitude of the received signal on the signal path in response to an agc control signal;

a local oscillator which generates an oscillator signal, the oscillator signal being supplied to the first mixer; and sensor means, responsive to the received signal on the signal path and to the oscillator signal, for generating the agc control signal, the sensor means including a second mixer, the second mixer receiving the oscillator signal, first transmission channel means for conveying the received signal from the signal path to the second mixer, the first transmission channel means imposing a first degree of distortion, second transmission channel means for simultaneously conveying the received signal in phase opposition from the signal path to the second mixer, the second transmission channel means imposing a second degree of distortion that is different from the first degree of distortion, and output means connected to the second mixer for generating the agc control signal.

2. A radio receiver according to claim 1, wherein the means for conveying imposes a degree of distortion on the received signal, wherein the degree of distortion imposed by one of the transmission channel means is low, and wherein the degree of distortion imposed by the other transmission channel means is greater than the degree of distortion imposed by the means for conveying.

3. A radio receiver according to claim 1, wherein the means for conveying imposes a degree of distortion on the received signal, wherein the degree of distortion imposed by one of the transmission channel means is equal to the degree of distortion imposed by the means for conveying, and wherein the degree of distortion imposed by of the other transmission channel means is lower than the degree of distortion imposed by the means for conveying.

4. A radio receiver according to claim 1, wherein the first mixer is an IF mixer which emits a main IF signal having a bandwidth, and wherein the output signal from the second mixer is an IF signal having the same bandwidth as the main IF signal or a greater bandwidth than the main IF signal.

5. A radio receiver according to claim 1, wherein the agc means reduces the amplitude of the received signal when interference falls into a desired channel.

6. A radio receiver according to claim 1, wherein the means for conveying comprises a rectifier circuit, said rectifier circuit being designed to avoid overload effects.

7. A radio receiver according to claim 1, wherein the output means comprises means for filtering and demodulating an output signal from the second mixer, and evaluating circuit means for evaluating the peaks of the filtered and demodulated output signal higher than the mean value of said filtered and demodulated output signal.

8. A radio receiver according to claim 1, wherein the evaluating circuit means comprises a peak value rectifier.

9. A radio receiver according to claim 1, wherein each of the transmission channel means comprises a respective amplifier.

10. A radio receiver according to claim 9, wherein the amplifiers have different degrees of distortion.

11. A radio means according to claim 10, wherein the amplifiers have transistors and the different degrees of distortion are achieved by differing negative feedback in the emitters of the transistors of the amplifiers.

12. A radio receiver according to claim 11, wherein the different negative feedback in the amplifiers is achieved using resistors.

13. A radio receiver according to claim 10, wherein the amplifiers are differential amplifiers, wherein one differential amplifier is provided without negative feedback, and wherein the other differential amplifier has two transistors connected as diodes to provide negative feedback elements in the emitter branch.

14. A radio receiver according to claim 10, wherein the amplifiers are designed unsymmetrical such that second order distortions are picked up by the sensor means.

15. A radio receiver according to claim 1, wherein the means for conveying has a distortion characteristic, and wherein the distortion characteristic of the first and second transmission channel means is adapted to the distortion characteristic of the means for conveying.

16. A radio receiver according to claim 1, wherein the first mixer and the means for conveying a received signal to the first mixer have a non-linear character, wherein the sensor means has a non-linear character, and wherein the character of non-linearity of the sensor means largely corresponds to that of the first mixer and the means for conveying.

17. A radio receiver according to claim 1, wherein the sensor means has an adjustable sensitivity.

18. A radio receiver according to claim 1, wherein the output means comprises means for filtering and demodulating an output signal from the second mixer.

19. A radio receiver for use with an antenna, comprising:

a first mixer;

means for conveying a received signal to the mixer along a signal path from the antenna to the first mixer, the means for conveying including agc means for controlling the amplitude of the received signal on the signal path in response to an agc control signal;

a local oscillator which generates an oscillator signal, the oscillator signal being supplied to the first mixer; and sensor means, responsive to the received signal on the signal path and to the oscillator signal, for generating the agc control signal, the sensor means including second and third mixers, the second and third mixers receiving the oscillator signal, first transmission channel means for conveying the received signal from the signal path to the second mixer, the first transmission channel means imposing a first degree of distortion, the received signal being mixed with the local oscillator signal by the second mixer to provide a first mixed signal, second transmission channel means for simultaneously conveying the received signal from the signal path to the third mixer, the second transmission channel means imposing a second degree of distortion that is different from the first degree of distortion, the received signal being mixed with the local oscillator signal by the third mixer to provide a second mixed signal in phase opposition to the first mixed signal, and output means for generating the agc control signal from the sum of the first and second mixed signals.

20. A radio receiver according to claim 19, wherein the output means comprises means for filtering and demodulating the sum of the first and second mixed signals.

21. A radio receiver according to claim 19, wherein the means for conveying imposes a degree of distortion on the received signal, wherein the degree of distortion imposed by one of the transmission channel means is low, and wherein the degree of distortion imposed by the other transmission channel means is greater than the degree of distortion imposed by the means for conveying.

22. A radio receiver according to claim 19, wherein the means for conveying imposes a degree of distortion on the received signal, wherein the degree of distortion imposed by one of the transmission channel means is equal to the degree of distortion imposed by the means for conveying, and wherein the degree of distortion imposed by the other transmission channel means is lower than the degree of distortion imposed by the means for conveying.

23. A radio receiver according to claim 19, wherein the first mixer is an IF mixer which emits a main IF signal having a bandwidth, and wherein the output signal from the second and third mixers are IF signals having the same bandwidth as the main IF signal or a greater bandwidth than the main IF signal.

24. A radio receiver according to claim 19, wherein the agc means reduces the amplitude of the received signal when interference falls into a desired channel.

25. A radio receiver according to claim 19, wherein the means for conveying comprises a rectifier circuit, said rectifier circuit being designed to avoid overload effects.

26. A radio receiver according to claim 19, wherein the output means comprises means for filtering and demodulating an output signal from the second mixer, and evaluating circuit means for evaluating the peaks of the filtered and demodulated output signal higher than the mean value of said filtered and demodulated output signal.

27. A radio receiver according to claim 26, wherein the evaluating circuit means comprises a peak value recitifer.

28. A radio receiver according to claim 19, wherein each of the transmission channel means comprises a respective amplifier.

29. A radio receiver according to claim 28, wherein the amplifiers have different degrees of distortion.

30. A radio receiver according to claim 29, wherein the amplifiers have transistors and the different degrees of distortion are achieved by differing negative feedback in the emitters of the transistors of the amplifiers.

31. A radio receiver according to claim 30, wherein the different negative feedback in the amplifiers is achieved using resistors.

32. A radio receiver according to claim 29, wherein the amplifiers are differential amplifiers, wherein one differential amplifier is provided without negative feedback, and wherein the other differential amplifier has two transistors connected as diodes to provide negative feedback elements in an emitter branch.

33. A radio receiver according to claim 29, wherein the amplifiers are designed unsymmetrical such that second order distortions are picked up by the sensor means.

34. A radio receiver according to claim 19, wherein the means for conveying has a distortion characteristic, and wherein the distortion characteristic of the first and second transmission channel means is adapted to the distortion characteristic of the means for conveying.

35. A radio receiver according to claim 19, wherein the first mixer and the means for conveying a received signal to the first mixer have a non-linear character, wherein the sensor means has a non-linear character, and wherein the character of non-linearity of the sensor means largely corresponds to that of the first mixer and the means for conveying.

36. A radio receiver according to claim 19, wherein the sensor means has an adjustable sensitivity.

* * * * *